United States Patent [19]

Artieri

[11] Patent Number: 4,903,231

[45] Date of Patent: Feb. 20, 1990

[54] TRANSPOSITION MEMORY FOR A DATA PROCESSING CIRCUIT

[75] Inventor: Alain Artieri, Meylan, France

[73] Assignee: SGS-Thomson Microelectronics S.A., Gentilly Cedex, France

[21] Appl. No.: 214,252

[22] Filed: Jul. 1, 1988

[30] Foreign Application Priority Data

Jul. 3, 1987 [FR] France ............................... 87/09458

[51] Int. Cl.⁴ ............................................. G06F 12/00
[52] U.S. Cl. .................................................. 364/900
[58] Field of Search ................................ 364/200, 900

[56] References Cited

U.S. PATENT DOCUMENTS 3,535,694 10/1970 Anacker et al. ..................... 364/200
4,302,775 11/1981 Widergren et al. ................. 358/136
4,791,598 12/1988 Liou et al. ............................ 364/725

Primary Examiner—Raulfe B. Zache

Attorney, Agent, or Firm—Lowe, Price, LeBlanc, Becker & Shur

[57] ABSTRACT

A memory of $n \times n$ digital data, is adapted to receive the $n \times n$ data from a matrix block in line order after line and to output the data in column after column order. Such a memory is particularly useful for circuits carrying out digital transformations such as cosinus transformations wherein one must first carry out a line transformation then a column summation.

The memory is constituted by a network of $n \times n$ registers REG(i,j) and of $n \times n$ multiplexers MUX(i,j); the registers are operated at a period T and the multiplexers at a period $n \times T$. The connections between the memory inputs and outputs and the register network are alternatively connected at the period $n \times T$ in order that in a first phase the data are introduced and "horizontally" shifted inside the network and that in a second phase the data are introduced and "vertically" shifted.

4 Claims, 5 Drawing Sheets

TRANSPOSITION MEMORY FOR A DATA PROCESSING CIRCUIT

BACKGROUND OF THE INVENTION

The instant invention relates to integrated circuits for digital signal processing, more specifically for circuits that perform a double weighted summation, first in line then in column, of digital values x(i,j) of a n×n digital value matrix.

From coefficients x(i,j) where i is a line index of the matrix, and j a column index, one tries to provide for a matrix of coefficients C(u,v) where u is a line index and v a column index, with $$C(u,v) = \sum_{i=0}^{i=n-1} C^i(v) g(i,u)$$

$$\text{with } C^i(v) = \sum_{j=0}^{j=n-1} x(i,j) f(j,v)$$

From the input electrical signals representing the digital values x(i,j) n×n signals representing coefficients $C^i(v)$ are produced; each coefficient $C^i(v)$ represents a weighted summation of values x(i,j) of the line i multiplied by coefficients f(j,v); v represents a column index varying from 0 to n−1 and there are n coefficients $C^i(v)$ for each line of index i. This operation is called line transformation.

From the n×n signals representing the coefficients $C_i(v)$, n×n signals representing the coefficient C(u,v) are provided; each coefficient C(u,v) is a weighted summation of the values $C_i(v)$ of the column v, multiplied by coefficients g(i,u); u represents a line index varying from 0 to n−1 and n coefficients are provided for each column of index v. This operation is the column transformation.

This type of digital processing is especially used for carrying out transformations called cosinus transformations wherein the coefficients f(j,v) and g(i,u) are of the cos (2i+1)uπ/2n; those transformations are useful for permitting the compression of information in the digital transmission of signals, and more specifically for the digital transmission of pictures.

The integrated circuit architectures used to carry out this kind of transformation are relatively complex since they must permit a real time processing, that is, the flow of digital data to be processed is assigned at the input of the circuit and the flow of the processed data at the output must be as fast as the flow at the input. Of course, this flow is high and, as an example, for the digital transmission of pictures, one wishes to be able to process a block of 16×16 digital values (256 pixels) within less than 20 microseconds with successive blocks of 256 values arriving at the input of the circuit with a periodicity in the range of 20 microseconds.

Figure 1:
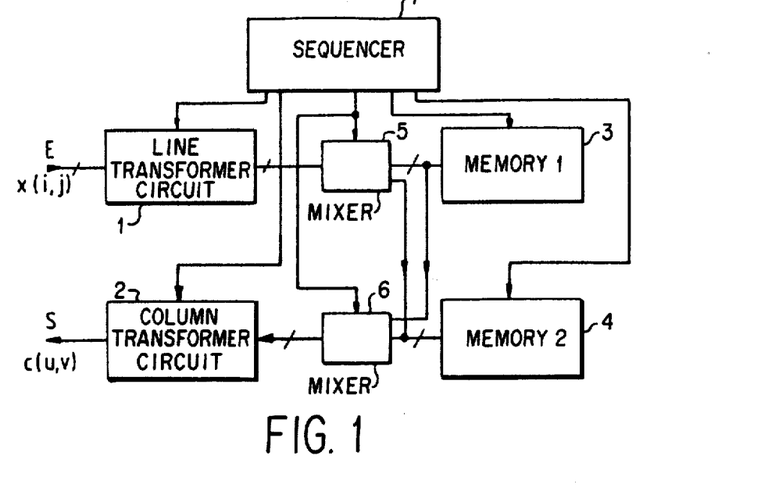
FIG. 1, already disclosed, shows a possible circuit architecture carrying out a double digital value summation, in line then in column.

FIG. 1 shows a block diagram of a relatively simple integrated circuit architecture that may be devised for carrying out, on one integrated circuit chip, the entire transformation of a block of n×n digital values x(i,j) into a block of n×n coefficients C(u,v).

In this diagram, one uses a first operator, line transformer circuit 1 CTL performing the line summation, a second operator, column transformer circuit 2 CTC performining the column summation, two memories 3 and 4 for storing values representing the coefficients $C^i(v)$, and two mixing circuits 5 and 6 for establishing connection paths, on the one hand between the line transformer circuit 1 and memories 3 and 4, and on the other hand between those memories and the column transformer 2. The whole set is controlled by a sequencer 7.

One block of n×n data x(i,j) to be processed is fed through an input bus E to the line transform operator CTL which provides n×n digital data representing n×n digital coefficients $C^i(v)$. Those data are stored in the n×n addresses of the memory 3 (memory of n×n words). The processing speed of the blocks of n×n data is, for example, of one block every 20 microseconds; a data x(i,j) arrives, for example, every 74 nanoseconds (for n×n=256).

To process the following block of n×n values x(i,j) circuit 1 receives the successive values x(i,j) and carries out the line transformation; then, the sequencer 7 controls the mixing circuit 5 in order to store the results $C^i(v)$ into the second memory 4. Meanwhile, the data previously recorded in the memory 3 are applied as input digital values to be processed, through the mixing circuit 6, onto the column transformation circuit 2 that provides the coefficients C(u,v) at its output.

Then, alternately, one block of n×n coefficients $C^i(v)$ is stored in one of the memories while one block of coefficients $C^i(v)$, recorded in the other memory during the previous time period, is processed.

This architecture is elegant but requires two memories, each one being capable of storing n×n data $C^i(v)$. It must be clearly understood that to carry out a column transformation on the coefficients $C^i(v)$ all the coefficients $C^i(v)$ of column v have to be stored. However, since those coefficients $C^i(v)$ arrive from the circuit CTL line after line, and not column after column, this practically means that the column transformation can start only when all the coefficients $C^i(v)$ of the matrix have arrived from circuit 1. This is the reason why the architecture shown in FIG. 1 uses two memories operating alternately. Moreover, it must be appreciated that if data $C^i(v)$ are recorded in one memory line after line (i being the line index), they must be read at the following time period column after column (v being the column index).

Moreover, if this architecture is used together with operators 2 and 1 processing digital data, the bits are transmitted in series (or partially transmitted in series) in contrast to parallel transmission. Therefore one has to provide for series/parallel and parallel/series converters between the operators and the memories, because the conventional SRAM or DRAM memories can only process data bits which are fed in parallel form. With data words greater than 4 bits, operators 2 and 1 operating on series or series/parallel bits should be provided.

SUMMARY OF THE INVENTION

The instant invention provides for a new transposition memory structure to receive data grouped line after line and to output data grouped column after column; this memory replaces both memories of FIG. 1, the mixing circuits between those memories and the operators 2 and 1 by a single memory block. Moreover, this memory avoids the use of the series/parallel and parallel/series converters whenever the data are processed in the operators in the series or series/parallel form.

The memory according to the invention has n inputs for receiving n data grouped line after line and n outputs for providing the data grouped column after column, the data being the n×n data of a data square matrix, the data being transmitted and processed in the form of electrical signals. The memory comprises a register and multiplexer network, arranged according to lines and columns, each register being associated with a multiplexer. The register at the crossing point of a line i and a column j being labelled REG(i,j) and the corresponding multiplexer being labelled MUX(i,j), the multiplexer MUX(i,j) having a first input connected with the output of register REG(i,j−1), a second input connected with the output of register REG(i+1,j) and one output connected with the input of register REG(i,j), the multiplexer output transmitting the status of the first input during a first operating phase of the memory and transmitting the status of the second input during a second phase. For the first and last lines and columns of the network, the connections are as follows:

(a) the first inputs of the multiplexers of the first column (rank 0) are each connected with a respective input of the memory;

(b) the outputs of the registers of the last column (rank n−1) are each connected through a respective switch to a respective memory output, this switch being closed during the first phase and open during the second phase;

(c) the output of each register of the first line (rank 0) is connected, through a switch open during the first phase and closed during the second phase, with a respective memory output;

(d) the second input of each multiplexer of the last line (rank n−1) is connected with a respective memory input.

Each register is periodically filled with new data and cleared of the data previously recorded; the time period T corresponds to the introduction frequency of new data into the memory. The first and second operating phases of the memory, that is the first and second phases of closing and opening the switches and switching the multiplexers, have respective time durations equal to $n \times T$.

This type of memory can be used with registers, each of which stores in parallel several data bits, as well as with registers each of which has as many storing cells in parallel as bits in each data. In this case, the memory can be directly used between two operators such as 1 and 2 if those operators operate on data transmitted in the form of parallel bits.

The present invention is particularly advantageous whenever the operators operate on data transmitted both in series and in parallel (for example, each data is made up of 16 bits, transmitted through two wires in eight successive steps), or on data entirely transmitted in series on one wire (for example, 16 bit-data transmitted on one wire in sixteen successive steps).

In this case, each register is a shift register with various successive positions between its input and its output; the number of successive positions between the input and the output is equal to the number p of serial bits of the data to be processed; the register is operated with a time period $t = T/p$. If the data are more generally available in the form of m parallel bits and p serial bits (that is, each data is transmitted on m conductors in p steps, the total bit number for each data being $m \times p$), then, each shift register comprises m parallel registers each of which receives the bits of one of the m conductors, each of the multiplexers comprising also m first inputs, m second inputs and m outputs, each one being associated with a specific conductor.

The data processing circuit shown in FIG. 1 can then be replaced by a much simpler architecture wherein operator 2 is connected with operator 1 through a single transposition memory according to the invention, even if the operators operate on serial or partially serial data.

BRIEF DESCRIPTION OF THE DRAWINGS

Other features and advantages of the instant invention will clearly appear in the following detailed description of preferred embodiments, in connection with the attached drawings, wherein.

DESCRIPTION OF PREFERRED EMBODIMENTS

Figure 2:
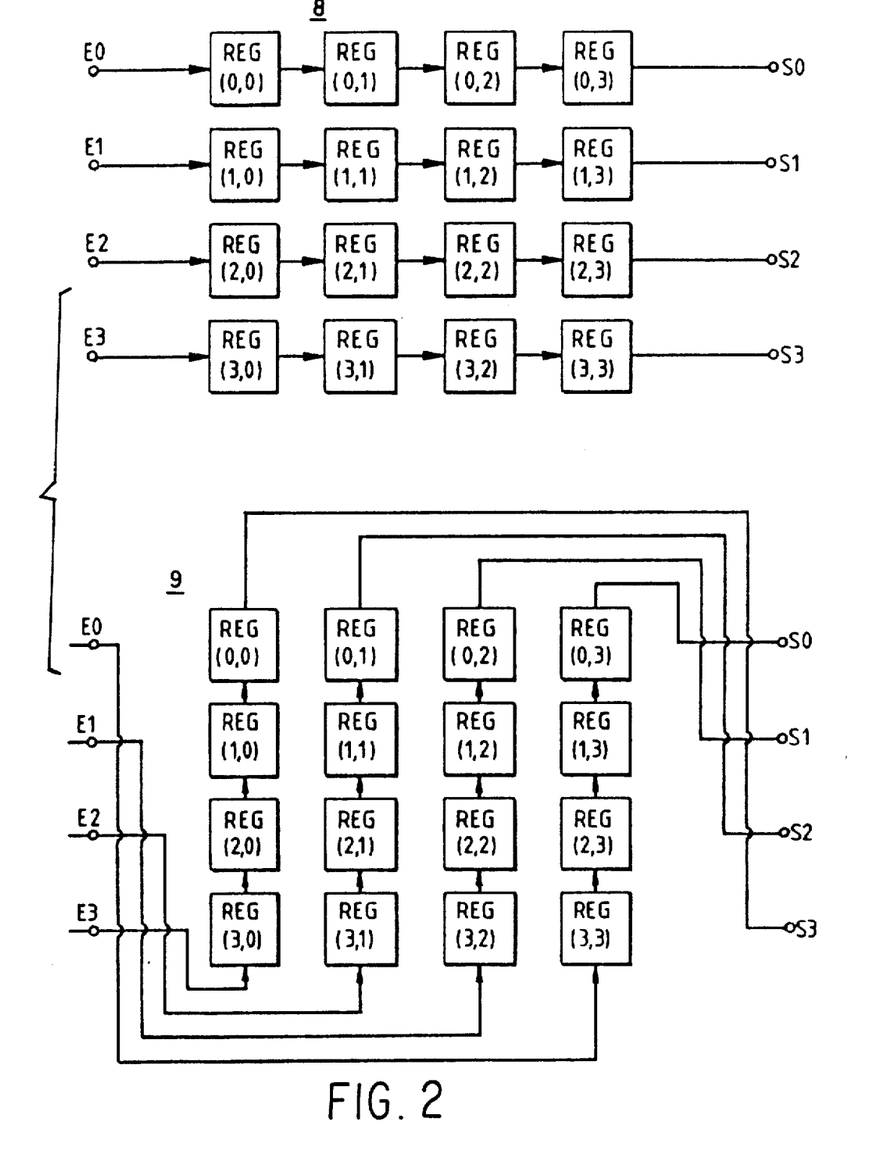
FIG. 2 symbolically shows the register network making up the memory according to the invention, with two different connection configurations between the registers and the memory inputs and outputs.

For a better understanding of the invention, FIG. 2 shows a simplified network of registers arranged according to lines and columns and which is designed for storing a matrix of $n \times n$ digital data, where $n = 4$. The network is shown according to two connection configurations corresponding to two successive operating phases, each of which has a time duration of $n \times T$, wherein T is the introduction period of the successive data into the network. The phases are hereinafter labelled phase a and phase b, respectively.

At the top of FIG. 2 is shown the first configuration, corresponding to the first phase (phase a). At the bottom of the figure is shown the second configuration, corresponding to the second phase (phase b).

The network comprises n inputs, E0, E1, E2, E3, and n outputs S0, S1, S2, S3. It further comprises $n \times n$ registers 8, each of which being capable of storing one digital data from an $n \times n$ data matrix which is made up as follows for $n = 4$:

| | | | |
|---|---|---|---|
| $C^0(0)$ | $C^0(1)$ | $C^0(2)$ | $C^0(3)$ |
| $C^1(0)$ | $C^1(1)$ | $C^1(2)$ | $C^1(3)$ |
| $C^2(0)$ | $C^2(1)$ | $C^2(2)$ | $C^2(3)$ |
| $C^3(0)$ | $C^3(1)$ | $C^3(2)$ | $C^3(3)$ |

The registers are labelled with references REG(i,j) wherein i is the line number and j is the column number of the register; therefore, the first line comprises registers REG(0,0), REG(0,1), REG(0,2), REG(0,3), the second line comprises registers REG(1,0), REG(1,1), etc. . . .

In the first operating phase (a), inputs E0 to E3 of the network are connected with the inputs of the various registers of the first column, and the outputs S0 to S3 of the network are connected with the outputs of the last column registers. Moreover, the input of each register of a column other than the first one, is connected with the output of the register of the previous column on the same line.

The data of the above mentioned matrix block are successively fed, line after line, onto inputs E0 to E3, that is, during a first time period T, the inputs receive the four data of the first line, then, during the following period, the ones of the second line, etc. . . .

The network contains all the data and after a time period equal to $n \times T$; those data then have the following configuration inside the register network:

| $C^3(0)$ | $C^2(0)$ | $C^1(0)$ | $C^0(0)$ |
|---|---|---|---|
| $C^3(1)$ | $C^2(1)$ | $C^1(1)$ | $C^0(1)$ |
| $C^3(2)$ | $C^2(2)$ | $C^1(2)$ | $C^0(2)$ |
| $C^3(3)$ | $C^2(3)$ | $C^1(3)$ | $C^0(3)$ |

In the second operating phase (b), also lasting a time duration $n \times T$, the interconnection configuration inside the register network 9 varies and becomes the one shown at the bottom of FIG. 2. Inputs E0, E1, E2, E3 are connected with the inputs of the registers of the last line, and outputs S0, S1, S2, S3 are connected with the outputs of the registers of the first line. Moreover, the input of each register of each line, except for the last one, is connected with the output of the register of the following line in the same column.

Therefore, during this second phase of n time periods T, the register network will, on the one hand, be loaded with new data (another matrix block of $n \times n$ data), and, on the other hand, will shift out the data previously stored.

However, the shifting out operation is carried out through the registers of the first line and the data progressively move upwards from the other lines towards the first line, with the result that the outgoing data are first the following ones:

$C^3(0)$ $C^2(0)$ $C^1(0)$ $C^0(0)$ then the following datas:

$C^3(1)$ $C^2(1)$ $C^1(1)$ $C^0(1)$ etc.

In other words, whereas the data of the matrix block had been introduced line after line during the first phase, they are taken out column after column.

Similarly, during this second phase, one introduces again the data line after line, as previously, but they arrive through the last line of the register network and progressively move upwards "vertically" from one line to the former one (whereas in the first phase, they moved "horizontally" from one column to the following one).

As a result, the data configuration in the register network is as follows at the end of the second phase:

| $C'^0(3)$ | $C'^0(2)$ | $C'^0(1)$ | $C'^0(0)$ |
|---|---|---|---|
| $C'^1(3)$ | $C'^1(2)$ | $C'^1(1)$ | $C'^1(0)$ |
| $C'^2(3)$ | $C'^2(2)$ | $C'^2(1)$ | $C'^2(0)$ |
| $C'^3(3)$ | $C'^3(2)$ | $C'^3(1)$ | $C'^3(0)$ |

The prime mark indicates a new data block.

A first phase a is then started again, that is, one passes again into the connection configuration shown at the top of FIG. 2 and the data are horizontally taken out; the first data going out according to the following order:

| then | $C'^0(0)$ | $C'^1(0)$ | $C'^2(0)$ | $C'^3(0)$ |
|---|---|---|---|---|
|  | $C'^0(1)$ | $C'^1(1)$ | $C'^2(1)$ | $C'^3(1)$ |

In other words, once more, that data that had been introduced line after line during the second phase are restored column after column during a new first phase.

Figure 3:
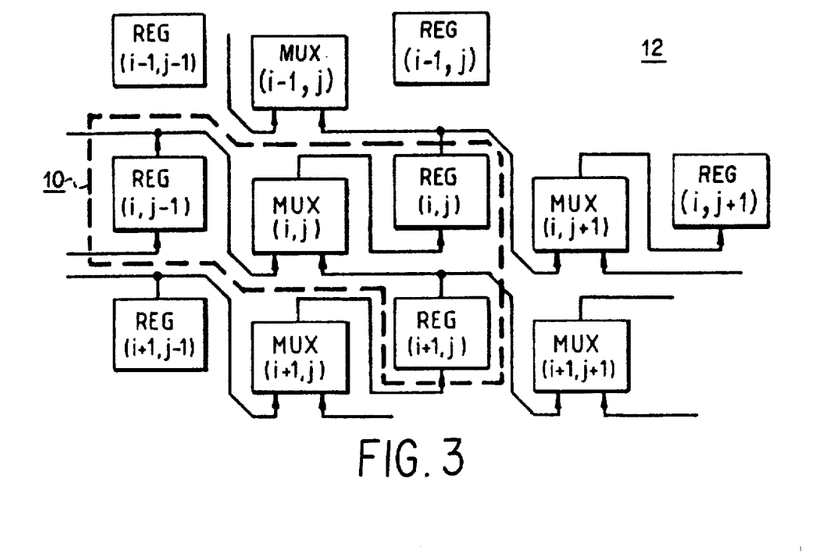
FIG. 3 shows an elementary structure of the register network according to the invention, with connections between the adjacent registers.

Whereas FIG. 2 is only a symbolic diagram of the register connections in the two alternate configurations of the network, FIG. 3 shows the actual structure of the network which permits the processing operation hereinabove disclosed.

In FIG. 3 shows a few adjacent cells of the register network in order to illustrate their interconnections. The elementary pattern 10 which is recurrent in the whole network is surrounded with a dashed line.

A multiplexer MUX(i,j) is associated with each register REG(i,j) corresponding to the ith line and jth column.

The line index i varies from 0 to $n-1$ and the column index j also varies from 0 to $n-1$.

Each register comprises one input and one output and regularly stores, within a time period T, one new data arriving at its input.

Each multiplexer comprises one first and one second input and one output. It provides at its output the signal present at its first input during the first phase (phase a), and, on the contrary, the signal present at its second input during the second phase (phase b). It is therefore controlled by a logic signal with a time period of $2n \times T$ representing the two operating phases of the memory.

Specific embodiments of registers and multiplexers will be later disclosed, but their structure depends upon the type of data that are received:

(a) if the data are supplied in the form of m bits in parallel, the inputs and outputs of the registers and of the multiplexers are buses of m conductors; each register has m cells in parallel;

(b) If the data are supplied in the form of p bits in series, the inputs and outputs each time comprise a single conductor transmitting those bits with a regular rythm having a period $t=T/p$; the register is a shift register with p successive positions, operated at the period $t=T/p$, and each data bit introduced into the register input is found again at the output after a time period T;

(c) If the data are processed series/parallel manner, the structure is dual: if the data comprise p bits in series on each of the m conductors, the inputs and outputs of the registers and multiplexers are buses of m conductors, and the registers are sets of m parallel operating shift registers, each shift register comprising p successive positions and being operated at the period $t=T/p$.

The invention proves particularly interesting for cases (b) and (c).

With reference to FIG. 3, it is apparent that the connection configuration which is recurrent on the whole network is as follows: the first input of the multiplexer MUX(i,j) of line i and column j is connected with the output of the register REG(i,j−1), that is, the register of the column having a rank immediately lower on the same line i; the second input of the multiplexer is connected with the output of register REG(i+1,j), that is, the register of the following line of the same column j.

The multiplexer output is connected with the input of the register REG(i,j).

This interconnection configuration is recurrent on the whole network except, of course, for the extremities of the network, that is, the first and last lines and columns.

Figure 4:
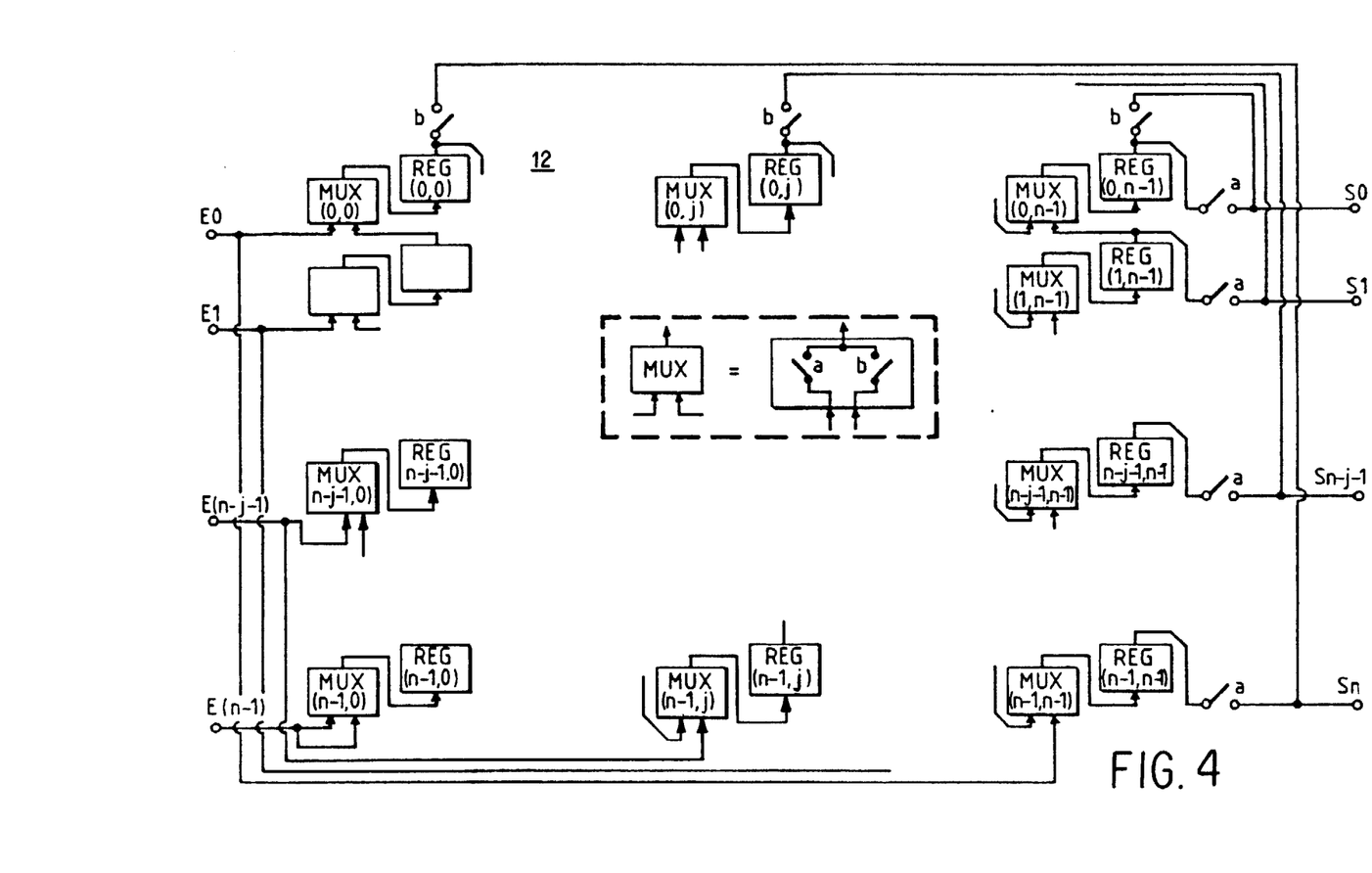
FIG. 4 shows the interconnections between the memory inputs and outputs as well as the first and last lines and columns of the register network.

FIG. 4 shows the connections between those first and last lines and columns and the inputs and outputs of the network 12.

Those connections are carried out through switches operated at the same periodicity n×T as the multiplexers so that the network effectively switches from the configuration shown in top of FIG. 2 to the configuration shown at the bottom of FIG. 2 within this same period.

Connections are as follows:

All the multiplexers of the first column (rank 0) have their first input directly connected with a respective input of the memory: the first input of the multiplexer MUX(0,0) is connected with input E0, the input of multiplexer MUX(1,0) is connected with input E1, the input of mulitplexer MUX(n−j−1,0) is connected with input E(n−j−1), etc. ...

The output of each register of the first line (rank 0) is connected through a respective switch, open during the first phase a and closed during the second phase b, with a respective output of the memory: the output of register REG(0,0) is connected through one switch with the output S(n−1); the output of register REG(0,j) is connected with output S(n−j−1); the output of register REG(0,n−1) is connected with output S0.

The output of each register of the last column (rank n−1) is connected through a respective switch, closed during the first phase a and open during the second phase b, with one memory output: the output of register REG(0,n−1) is therefore connected with output S0, the output of register REG(1,n−1) is connected with output S1, etc. ...

Finally, the second input of each multiplexer of the last line (rank n−1) is connected with a respective memory input: the second input of multiplexer MUX(n−1,0) is connected with input E(n−1), the input of multiplexer MUX(n−1,j) is connected with input E(n−j−1), the input of multiplexer MUX(n−1,n−1) is connected with input E0. The second multiplexer input is the one that is connected with its output during the phase b while the first input is connected with its output during the phase a.

The circuit disclosed in connection with FIGS. 3 and 4 constitutes a single memory of n×n data wherein a block of n×n data is introduced line after line and wherein the data are rearranged column after column while a new data block is introduced line after line.

Figure 5:
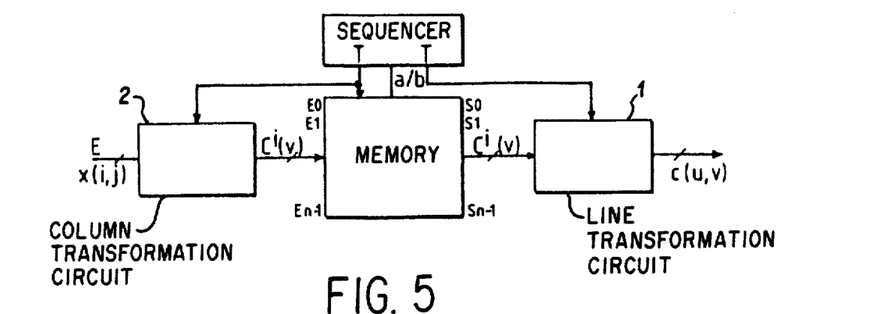
FIG. 5 shows a data processing circuit using a memory according to the invention.

The processing circuit architecture of the digital data shown in FIG. 5 can therefore be carried out; it is much simpler than the two-memory architecture shown in FIG. 1, and is further extremely advantageous whenever operators column transformation circuit 2 and line transformation circuit 1 are processing data of the serial type.

With reference to the following figures, a preferred embodiment of this memory will be disclosed in the general case wherein the data arrive in the series/parallel form: it will be admitted that the data arrive in p serial bits on a m conductor bus.

Figure 6:
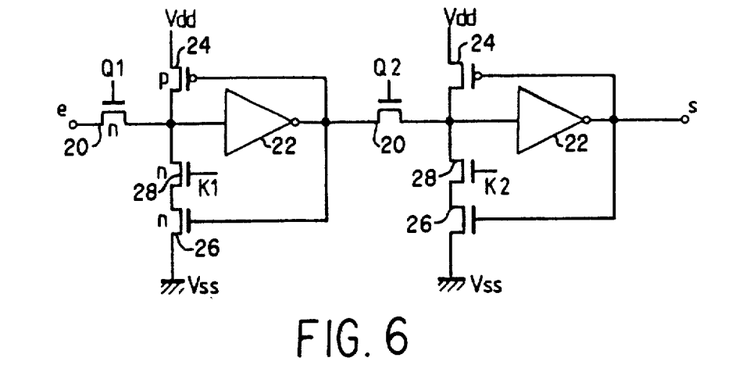
FIG. 6 shows an elementary register for storing a single data bit.

The basic register that can be used for storing a data bit is shown in FIG. 6.

Figure 7:
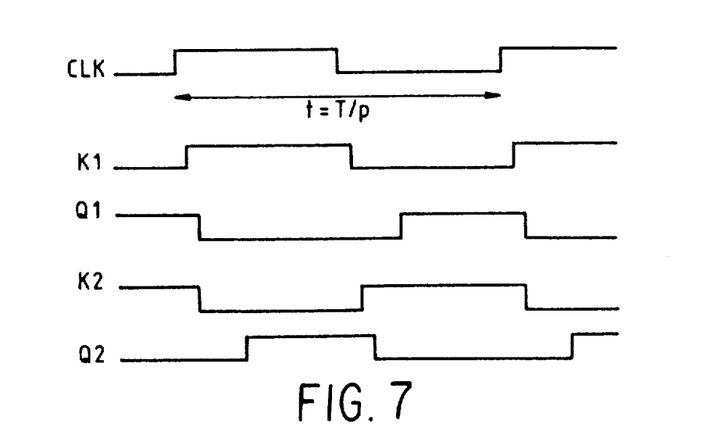
FIG. 7 shows the timing diagram of the control signals of the elementary register shown in FIG. 6.

It comprises two identical stages in cascade and is controlled by four clock signals with a period $t=T/p$; those signals are shown in FIG. 7; they are emitted from a clock CLK having a period T/p; signals K1 and Q1 control the first register stage; signals K2 and Q2 control the second stage.

K1 is roughly identical to the signal CLK; K2 is obtained by simply inverting CLK; Q1 is a signal with a transition towards the low logical level following the transition of K1 towards the logical high level and having a transition towards the high level delayed with respect to the down transistion of Q2; Q2 has, with respect to K2 and Q1, the same relationship as Q1 with respect to K1 and Q2.

Each stage of the elementary register shown in FIG. 6 is comprised of a first N-channel transistor 20 in series between the input of the stage and the input of an inverter; this transistor is controlled by the signal Q1 (signal Q2 for the second stage); the output of the inverter is looped back, on the one hand, on the gate of a P-channel transistor 24 incorporated between a voltage source Vdd and the input of the inverter, and on the other hand, on the gate of a N-channel transistor 26; this latter transistor is in series between a ground terminal Vss and another N-channel transistor 28 connected with the inverter input and controlled by the signal K1 (or signal K2 for the second stage).

Figure 8:
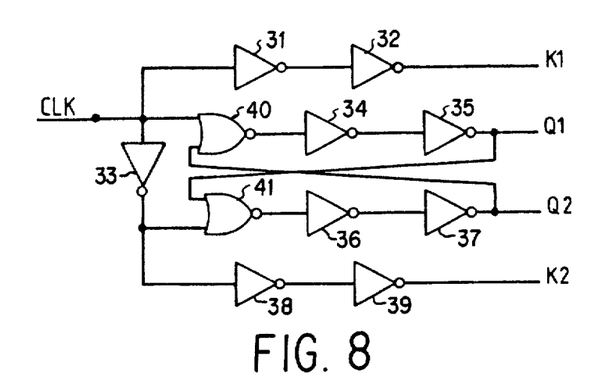
FIG. 8 shows the setting circuit of the elementary register of the control signals shown in FIG. 6.

FIG. 8 shows a circuit comprising nine inverters 31–39 and two NOR gates 40,41 permitting to generate the signals K1, Q1, K2, Q2 from a symmetrical clock signal CLK with a period of T/p.

Figure 9:
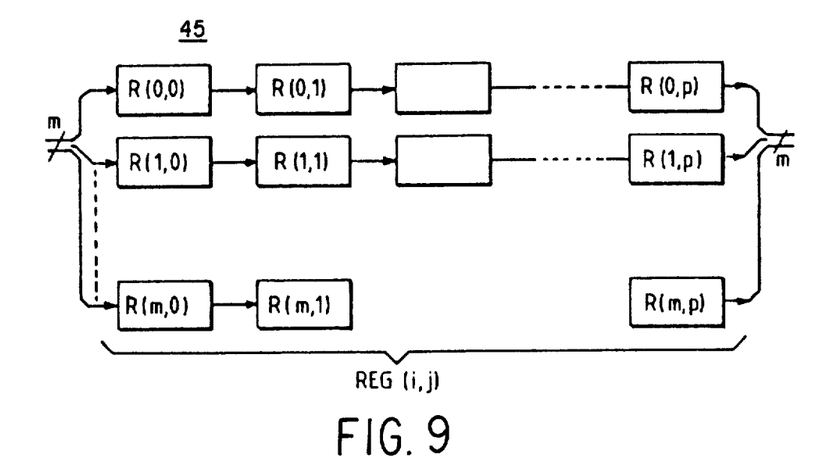
FIG. 9 shows a register REG(i,j) of the network constituting the memory according to the invention, this register comprising $m \times p$ elementary registers storing one bit.

FIG. 9 shows a practical embodiment of a register 45 REG(i,j) from m×p elementary registers when the data comprise p serial bits on a bus of m parallel conductors; each rectangle of FIG. 9 shows an elementary register for storing one bit, that is, one rectangle corresponds to the two-stage circuit shown in FIG. 6.

The input of register REG(i,j) is carried out by means of a m-conductor bus, each conductor arriving at the input of a respective set of p elementary registers in cascade; there are m parallel sets each of which corresponds to a conductor of the input bus; the output of the last register of each set in cascade constitutes an output conductor of the register REG(i,j); the global output of register REG(i,j) is a bus of m conductors constituted by the output conductors of the m parallel sets.

All the elementary registers of the register REG(i,j) as well as other registers of the memory are controlled by the same signals K1, Q1, K2, Q2.

The multiplexers comprise in this case a first input constituted by a bus of m conductors, a second input constituted by a bus of m conductors, and one output constituted by a bus of m conductors, the output bus being connected with the bus of the first input during phase a and with the bus of the second input during phase b.

I claim:

1. A transposition memory comprising n inputs (E0 to En−1) for receiving n×n data groups line after line, and n outputs (S0 to Sn−1) for outputting the data grouped according to successive columns, the data being the n×n data of a data square matrix, the data being further transmitted and processed in the form of electrical signals, further comprising a network of n×n registers (REG(i,j)) and of n×n multiplexers (MUX(i,j)), arranged in lines and columns, each register being associated with one multiplexer and being marked by its location in line i and its location in column j, the multiplexer (MUX(i,j)) having a first input connected with the output of register REG(i,j−1), a second input connected with the output of register REG(i+1,j) and an output connected with the input of register (REG(i,j)), the multiplexer output transmitting the status of the first input during a first operating phase (a) of the memory and further transmitting the status of the second input during a second phase (b), and the connections of the registers and multiplexers of the first and last lines and columns of the network being as follows:

(a) the first inputs of the multiplexers of the first column (rank 0) are each connected with a respective input of the memory;

(b) the outputs of the registers of the last column (rank n−1) are each connected through a respective switch with a respective output of the memory, this switch being closed during the first phase and open during the second phase;

(c) the output of each register of the first line (rank 0) is connected, through a switch open during the first phase and closed during the second phase, with a respective output of the memory;

(d) the second input of each multiplexer of the last line (rank n−1) is connected with a respective input of the memory.

2. A memory according to claim 1, wherein each register is periodically filled with a new data and cleared of the previously recorded data within a time period T corresponding to the introduction frequency of the new data into the memory, and wherein the first and second operating phases of the memory each last a time period n×T.

3. A memory according to claim 2, wherein each register is constituted of m parallel sets of p elementary registers in cascade, each elementary register being capable of storing one data bit and being periodically operated in order to receive and transmit a new bit, the period being a period T/p wherein T is the introduction time period of new data into the memory, the input of register REG(i,j) being constituted by a bus of m conductors and its output being constituted by another bus of m conductors, the multiplexer inputs and outputs being also constituted by buses of m conductors.

4. A digital data processing circuit for carrying out, on one block of n×n data transmitted in the form of electrical signals, a data line summation followed with a data column summation of the result of the line summation, comprising a first operator (CTL) for the line summation, receiving the data to be processed, the outputs of the first operator being connected with the inputs of a memory, according to claim 1, and the outputs of the memory being connected with the inputs of a second operator (CTC) for the column summation.

* * * * *